United States Patent
Park

(10) Patent No.: US 12,219,696 B2
(45) Date of Patent: Feb. 4, 2025

(54) ELECTRONIC DEVICE

(71) Applicant: Samsung Display Co., Ltd., Yongin-si (KR)

(72) Inventor: Sungjune Park, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 586 days.

(21) Appl. No.: 17/143,361

(22) Filed: Jan. 7, 2021

(65) Prior Publication Data

US 2021/0259093 A1    Aug. 19, 2021

(30) Foreign Application Priority Data

Feb. 14, 2020    (KR) .................... 10-2020-0018622
Mar. 30, 2020   (KR) .................... 10-2020-0038346

(51) Int. Cl.
*H05K 1/02* (2006.01)
*G02F 1/1333* (2006.01)
*H05K 1/11* (2006.01)

(52) U.S. Cl.
CPC ....... *H05K 1/028* (2013.01); *G02F 1/133305* (2013.01); *H05K 1/118* (2013.01); *B32B 2307/21* (2013.01); *B32B 2457/20* (2013.01); *C09K 2323/04* (2020.08); *G02F 2202/22* (2013.01)

(58) Field of Classification Search
CPC ............ B32B 2457/20; B32B 2307/21; C09K 2323/04; C09J 133/04; C09J 133/08; C09J 133/10; C09J 133/12; C09J 2203/318
See application file for complete search history.

(56) References Cited

U.S. PATENT DOCUMENTS

| | | | |
|---|---|---|---|
| 9,099,685 B2 | 8/2015 | Kim et al. | |
| 9,461,256 B2 | 10/2016 | Lee et al. | |
| 10,268,058 B2 | 4/2019 | Moon | |
| 2011/0181813 A1* | 7/2011 | Kim | G02B 5/3058 349/96 |
| 2016/0184041 A1* | 6/2016 | Gafford | A61B 18/148 606/174 |
| 2020/0358014 A1 | 11/2020 | Park et al. | |

FOREIGN PATENT DOCUMENTS

| | | | | |
|---|---|---|---|---|
| JP | 2015160878 A | * | 9/2015 | ............... G02B 1/14 |
| JP | 2019135309 A | * | 8/2019 | |
| KR | 101174834 B1 | | 8/2012 | |
| KR | 1020140064481 A | | 5/2014 | |
| KR | 1020160082885 A | | 7/2016 | |
| KR | 1020190064201 A | | 6/2019 | |
| KR | 1020200129230 A | | 11/2020 | |
| WO | WO-2018180304 A1 | * | 10/2018 | ............... G02B 1/14 |
| WO | 018159285 A1 | | 12/2019 | |

* cited by examiner

*Primary Examiner* — Sophie Hon
(74) *Attorney, Agent, or Firm* — CANTOR COLBURN LLP

(57) ABSTRACT

A display device includes a display panel, a protection film which faces the display panel and includes a first surface closest to the display panel and a second surface which is opposed to the first surface, a first anti-static layer which defines the first surface of the protection film, a second anti-static layer which faces the first anti-static layer and defines the second surface of the protection film, and a polyimide film between the first anti-static layer and the second anti-static layer, and an adhesive layer which forms an interface with the first surface of the protection film and attaches the protection film to the display panel.

18 Claims, 8 Drawing Sheets

ELECTRONIC DEVICE

This application claims priority to Korean Patent Application Nos. 10-2020-0018622 filed on Feb. 14, 2020 and 10-2020-0038346 filed on Mar. 30, 2020, and all the benefits accruing therefrom under 35 U.S.C. § 119, the entire contents of which are hereby incorporated by reference.

BACKGROUND

(1) Field

The disclosure herein relates to a foldable electronic device including a protection film.

(2) Description of the Related Art

An electronic device displays various images on a display screen to provide information to a user. In general, the electronic device displays information within an assigned screen. Flexible electronic devices including a foldable flexible display panel are being developed. The flexible electronic device may be folded, rolled or bent unlike a rigid electronic device. The flexible electronic device which is variously changeable in shape, may be transported regardless of a typical screen size to improve convenience of a user.

SUMMARY

One or more embodiment provides an electronic device having improved product reliability.

An embodiment provides an electronic device including a display panel, a protection film which faces the display panel and includes a first surface closest to the display panel and a second surface which is opposed to the first surface, a first anti-static layer which defines the first surface of the protection film, a second anti-static layer which faces the first anti-static layer and defines the second surface of the protection film, and a polyimide film between the first anti-static layer and the second anti-static layer, and an adhesive layer which forms an interface with the first surface of the protection film and attaches the protection film to the display panel.

In an embodiment, the polyimide film may include biphenyl-tetracarboxylic acid dianhydride ("BPDA") and a filler.

In an embodiment, the filler may have a size of about 0.5 micrometer (μm) or more and about 2 μm or less.

In an embodiment, each of the first anti-static layer and the second anti-static layer may include a urethane-based binder.

In an embodiment, each of the first anti-static layer and the second anti-static layer may include isocyanate.

In an embodiment, the first surface of the protection film may have a polar surface energy of about 12 millinewtons per meter (mN/m) or more.

In an embodiment, the first surface of the protection film may have a surface resistance of about $10^6$ Ohms per square ($\Omega/\square$) or less.

In an embodiment, a top surface of the adhesive layer which is attached to the rear surface of the display panel, may have a surface resistance of about $10^9 \Omega/\square$ or more and about $10^{11} \Omega/\square$ or less.

In an embodiment, the adhesive layer may have a thickness of about 10 μm or more and about 25 μm or less.

In an embodiment, the polyimide film may have a yield point at a strain of about 1.5% or more.

In an embodiment, at least one of the polyimide film and the adhesive layer may further include an anti-static agent.

In an embodiment, the polyimide film may have a haze of about 5% or less.

In an embodiment, an electronic device includes a display panel, a protection film which faces the display panel, and an adhesive layer which attaches the display panel to the protection film. The protection film includes a first anti-static layer directly attached to the adhesive layer and including a first binder including urethane and a first anti-static material, and a base film facing the adhesive layer with the first anti-static layer therebetween and including BPDA.

In an embodiment, the base film may further include a filler having a size of about 0.5 μm or more and about 2 μm or less.

In an embodiment, the protection film may further include a second anti-static layer spaced apart from the first anti-static layer with the base film therebetween, and the second anti-static layer may include a urethane-based binder and an anti-static agent.

In an embodiment, a first surface of the first anti-static layer which is directly attached to the adhesive layer, may have a polar surface energy of about 12 mN/m or more.

In an embodiment, a first surface of the first anti-static layer which is directly attached to the adhesive layer, may have a surface resistance of about $10^6 \Omega/\square$ or less.

In an embodiment, a top surface of the adhesive layer which is attached to the rear surface of the display panel, may have a surface resistance of about $10^9 \Omega/\square$ or more and about $10^{11} \Omega/\square$ or less.

In an embodiment, the adhesive layer may have a thickness of about 10 μm or more and about 25 μm or less.

In an embodiment, the first anti-static layer may further include isocyanate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1A:
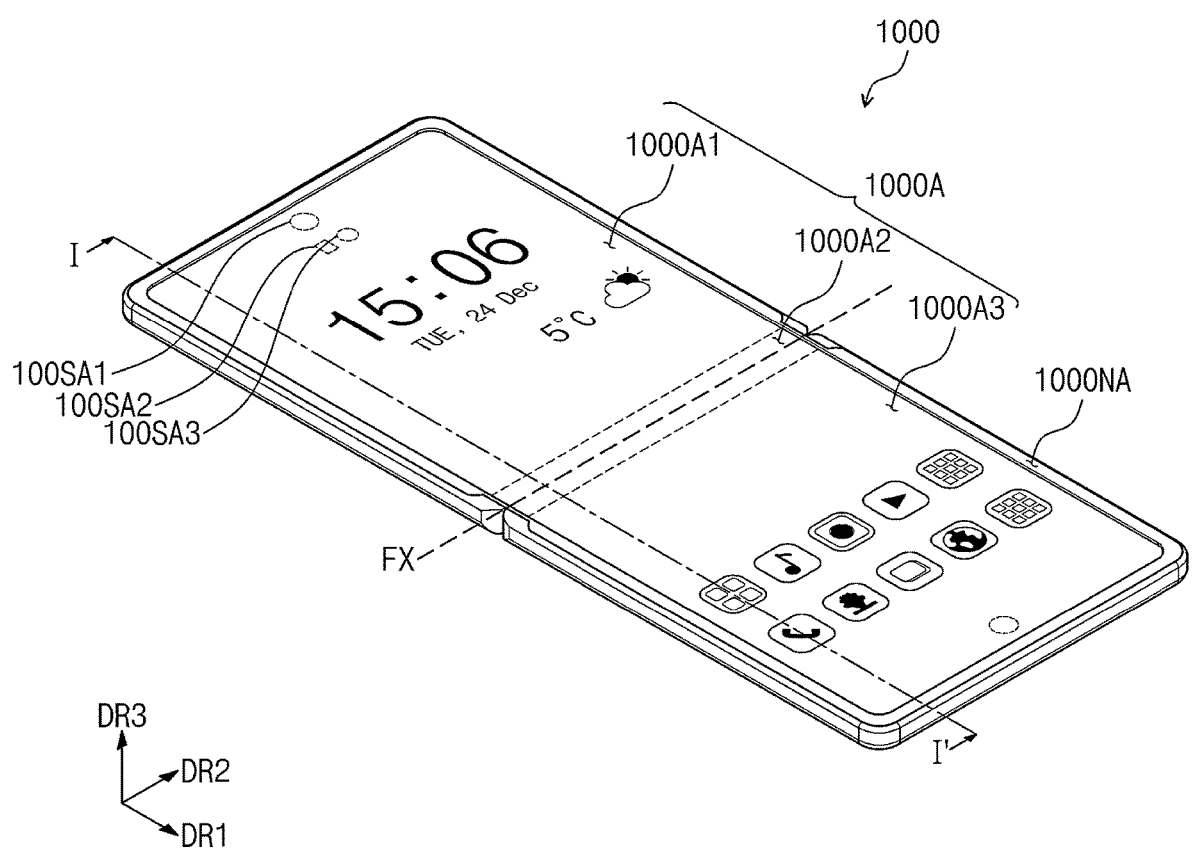
FIG. 1A is a perspective view of an embodiment of an electronic device.

In this specification, it will also be understood that when one component (or region, layer, portion) is referred to as being related to another element such as being "on," "connected to" or "coupled to" another component, it can be directly disposed/connected/coupled on/to the one component, or an intervening third component may also be present. In contrast, when an element (or n region, a layer, a portion, or the like) is referred to as being related to another element such as being "directly on," "directly connected to" or "directly coupled to" another element in the specification, no intervening elements are disposed therebetween.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. Also, in the figures, the thickness, ratio, and dimensions of components are exaggerated for clarity of illustration.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims.

Also, "under," "below," "above," "upper" and the like are used for explaining relation association of components illustrated in the drawings. The terms may be a relative concept and described based on directions expressed in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the accompanying drawings.

Figure 1B:
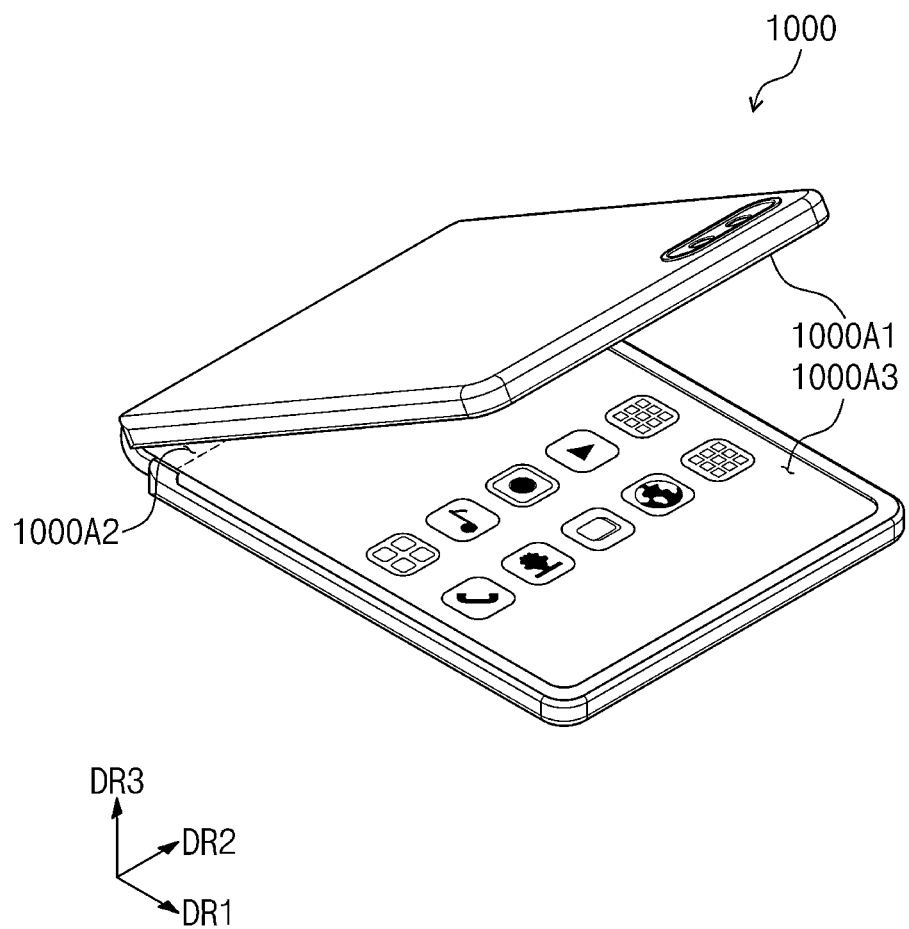
FIG. 1B is a perspective view of an embodiment of the electronic device of FIG. 1A which is folded.

FIG. 1A is a perspective view of an embodiment of an electronic device 1000. FIG. 1B is a perspective view of the electronic device 1000. FIG. 1A illustrates the electronic device 1000 which is unfolded, and FIG. 1B illustrates the electronic device 1000 which is folded.

Referring to FIGS. 1A and 1B, the electronic device 1000 may be activated according to an electrical signal. Although the electronic device 1000 may be a mobile phone, a tablet computer, a navigation unit for a vehicle, a game console or a wearable device as an example, the invention is not limited thereto. FIG. 1A illustrates a mobile phone as an example of the electronic device 1000.

The electronic device 1000 may display an image at an active area 1000A (e.g., a display area). The electronic device 1000 which is unfolded may dispose the active area 1000A in a plane defined by a first direction DR1 and a second direction DR2 which cross each other. The electronic device 1000 may have a thickness in a direction that is parallel to a third direction DR3 crossing each of the first direction DR1 and the second direction DR2. Thus, a front surface (or a top surface) and a rear surface (or a bottom surface) of members constituting the electronic device 1000 may be defined with respect to the third direction DR3.

The active area 1000A may include a first area 1000A1, a second area 1000A2 and a third area 1000A3 in order. The electronic device 1000 may be bendable or foldable at second area 1000A2 with respect to a folding axis FX extending along the second direction DR2. The first area 1000A1 and the third area 1000A3 may be referred to as non-folding areas, and the second area 1000A2 may be referred to as a folding area. The electronic device 1000 may be unfoldable or may remain flat even when the electronic device 1000 is folded at the second area 1000A2, without being limited thereto.

The electronic device 1000 which is folded may dispose the first area 1000A1 and the third area 1000A3 facing each other, such as to define in-folding of the electronic device 1000. Thus, the active area 1000A of the electronic device 1000 which is in-folded may not be exposed to outside the electronic device 1000. However, this is merely illustrative, and the invention is not limited to in-folding of the electronic device 1000.

In an embodiment, the electronic device 1000 which is out-folded may dispose the first area 1000A1 and the third area 1000A3 facing away from each other so as to be opposed to each other. Thus, the active area 1000A of the electronic device 1000 which is out-folded may be exposed to outside the electronic device 1000.

The electronic device 1000 may be only one among in-foldable and out-foldable. Alternatively, the electronic device 1000 may be both in-foldable and out-foldable. The electronic device 1000 may be both in-foldable and out-foldable may be in-foldable and out-foldable at a same area of the electronic device 1000, e.g., the second area 1000A2. Alternatively, one area of the electronic device 1000 may be in-foldable and another area thereof may be out-foldable.

Although one folding area and two non-folding areas are exemplarily illustrated in FIGS. 1A and 1B, the invention is not limited to the number of each of the folding area and the non-folding area. In an embodiment, for example, the electronic device 1000 may include two or more non-folding areas and a plurality of folding areas disposed respectively between the non-folding areas that are adjacent to each other.

Although the folding axis FX is exemplarily parallel to a minor axis of the electronic device 1000 in FIGS. 1A and 1B, the invention is not limited thereto. In an embodiment, for example, the folding axis FX may extend in parallel to a major axis of the electronic device 1000, e.g., the first direction DR1. In the electronic device 1000 including the folding axis FX which is parallel to the first direction DR1, the first area 1000A1, the second area 1000A2 and the third area 1000A3 may be sequentially arranged along the second direction DR2.

A plurality of sensing areas may be defined in the electronic device 1000. Although three sensing areas are exemplarily illustrated in FIG. 1A, the invention is not limited to the number of the sensing areas.

The plurality of sensing areas may include a first sensing area 100SA1, a second sensing area 100SA2 and a third sensing area 100SA3. In an embodiment, for example, the first sensing area 100SA1 may overlap a functional component such as a camera module of the electronic device 1000, and each of the second sensing area 100SA2 and the third sensing area 100SA3 may overlap a functional component such as a proximity illumination sensor. However, the invention is not limited thereto. The functional component may include, but is not limited to, any of a number of input or output devices which provide a function of the electronic device 1000. The function of the electronic device 1000 may receive and/or transmit elements such as light, pressure, proximity, location, etc. to provide the function. The functional component may be an example of an electronic module described hereafter.

An electronic module may receive an external input transmitted through the first sensing area 100SA1, the second sensing area 100SA2 and/or the third sensing area 100SA3 from outside the electronic device 1000 and/or provide an output to outside the electronic device 1000 through the first sensing area 100SA1, the second sensing area 100SA2 and/or the third sensing area 100SA3. That is, an electronic module may correspond to one or more of the first sensing area 100SA1, the second sensing area 100SA2 and/or the third sensing area 100SA3 to define a plurality of electronic modules.

The first sensing area 100SA1 may be surrounded by the active area 1000A, and each of the second and third sensing areas 100SA2 and 100SA3 may be a functional portion of the active area 1000A. That is, an image may be displayed at each of the second and third sensing areas 100SA2 and 100SA3, while an image may not be displayed at the first sensing area 100SA1. The first sensing area 100SA1 may define a non-display area within the display area. Each of the first sensing area 100SA1, the second sensing area 100SA2 and the third sensing area 100SA3 may have a light transmittance greater than a light transmittance of the active area 1000A. Also, the first sensing area 100SA1 may have a light transmittance greater than a light transmittance of each of the second and third sensing areas 100SA2 and 100SA3.

According to an embodiment, a first portion of the plurality of electronic modules may overlap the active area 1000A, and a second portion of the plurality of electronic modules may be surrounded by the active area 1000A. Thus, since a portion of the plurality of electronic modules corresponds to the active area 1000A (e.g., display area) a planar area of a peripheral area 1000NA (e.g., a non-display area) which is occupied by the plurality of electronic modules may be obviated. As a result, a ratio of a planar area the active area 1000A to a total planar area of a front surface of the electronic device 1000 may increase.

The peripheral area 1000NA may be adjacent to the active area 1000A. In an embodiment, the peripheral area 1000NA may surround the active area 1000A, without being limited thereto. A total planar area of the electronic device 1000 may include an entirety of the active area 1000A and an entirety of the peripheral area 1000NA.

Figure 2:
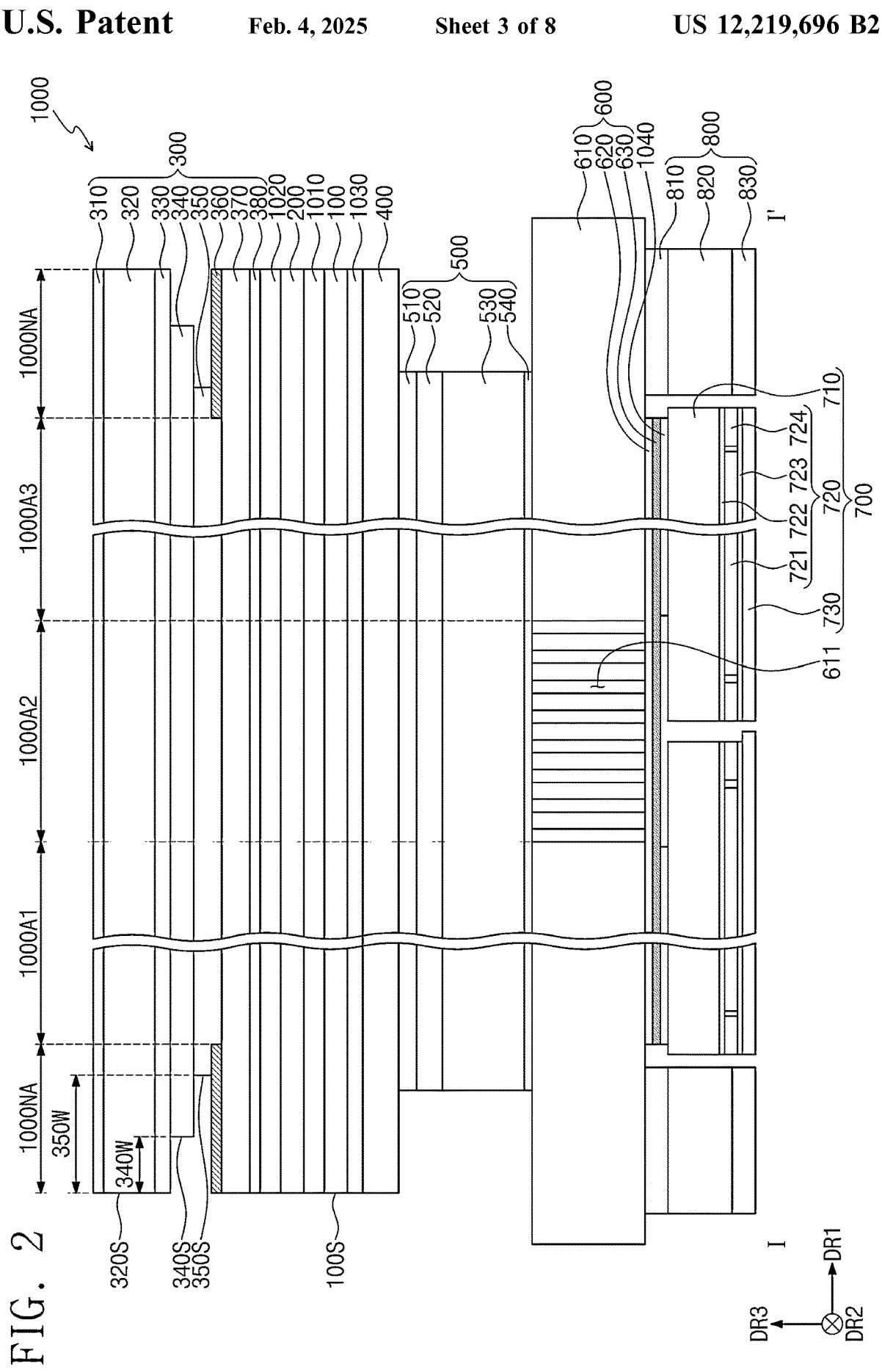
FIG. 2 is a cross-sectional view taken along line I-I' of FIG. 1A.
Figure 3A:
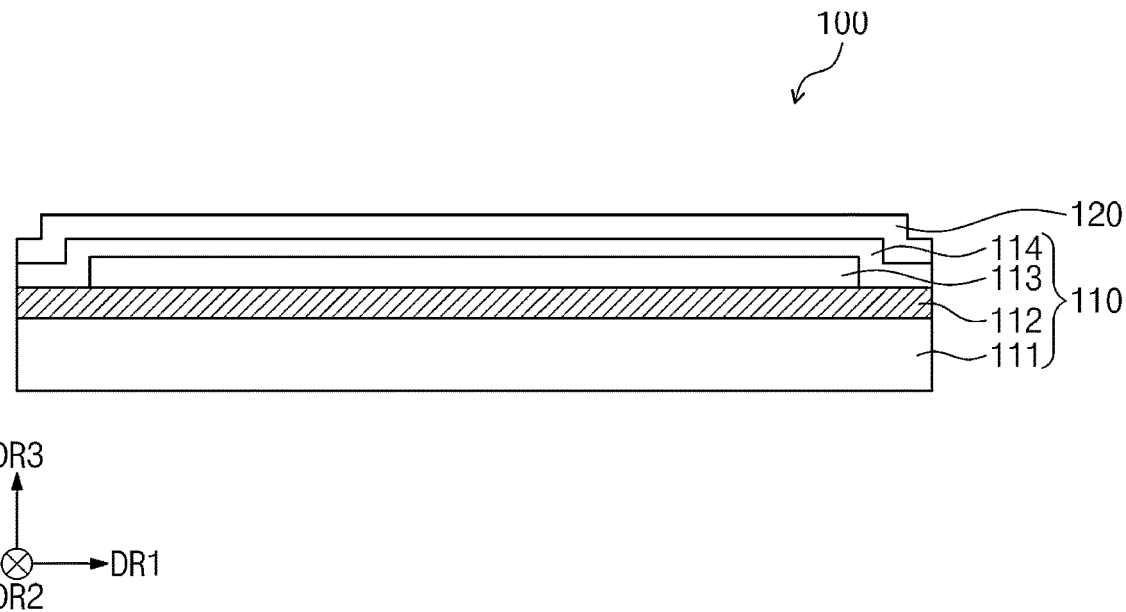
FIG. 3A is a cross-sectional view of an embodiment of a display panel.

FIG. 2 is a cross-sectional view of an embodiment of the electronic device 1000 taken along line I-I' of FIG. 1A. FIG. 3A is a cross-sectional view of an embodiment of a display panel 100.

Referring to FIG. 2, the electronic device 1000 may include a display panel 100, upper functional layers and lower functional layers. The upper functional layers may be referred to layers disposed above the display panel 100, and the lower functional layers may be referred to layers disposed below the display panel 100.

Referring to FIG. 3A, the display panel 100 may generate an image, display the image, sense an input applied from outside, etc. In an embodiment, for example, the display panel 100 may include a display layer 110 and a sensor layer 120 which faces the display layer 110. The display panel 100 may have a thickness of about 25 micrometers (μm) to about 35 μm, e.g., about 30 μm. However, the thickness of the display panel 100 is not limited thereto.

The display panel 100 may include at least one folding area. The folding area of the display panel 100 may be defined as a planar area of the display panel 100 overlapping or corresponding to the second area 1000A2. That is, the display panel 100 is foldable about the folding axis FX. One or more of the upper functional layers and one or more of the lower functional layers may be foldable together with the display panel 100. Where a layer is disconnected, disconnected portions of such layer may be movable together with the display panel 100, various layers of the upper functional layers and/or various layers of the lower functional layers.

The display layer 110 may include one or more component that substantially generates and/or displays an image, generates and/or emits light, etc. The display layer 110 may be a light emitting display layer such as, e.g., an organic light emitting display layer, a quantum dot display layer, or a micro-light emitting diode ("micro-LED") display layer.

The display layer 110 may include a base layer 111, a circuit layer 112, a light emitting element layer 113 and an encapsulation layer 114.

The base layer 111 may be a member which provides a base surface on which the circuit layer 112 is disposed. The base layer 111 may be a glass substrate, a metal substrate or a polymer substrate. However, the invention is not limited thereto, and the base layer 111 may be an inorganic layer, an organic layer or a composite material layer.

The base layer 111 may have a multi-layered structure. In an embodiment, for example, the base layer 111 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include at least one of an acrylate-based resin, a methacrylate-based resin, a poly-isoprene-based resin, a vinyl-based resin, an epoxy-based resin, a urethane-based resin, a cellulose-based resin, a siloxane-based resin, a polyamide-based resin and a perylene-based resin. In the disclosure, "~~"-based resin means that a functional group of "~~" is included.

The circuit layer 112 may be disposed on the base layer 111. The circuit layer 112 may include an insulation layer, a semiconductor pattern, a conductive pattern and a signal line. The insulation layer, the semiconductor layer and the conductive layer may be provided by a method such as coating and deposition, and then the insulation layer, the semiconductor layer and the conductive layer may be selectively patterned through a plurality of photolithography processes. Thereafter, the semiconductor pattern, the conductive pattern and the signal line, which are contained in the circuit layer 112, may be provided.

The light emitting element layer 113 may be disposed on the circuit layer 112. The light emitting element layer 113 may include a light emitting element which generates and/or emits light. In an embodiment, for example, the light emitting element layer 113 may include an organic light emitting material, a quantum dot, a quantum rod or a micro-LED.

The encapsulation layer 114 may be disposed on the light emitting element layer 113. Although the encapsulation layer 114 may include an inorganic layer, an organic layer and an inorganic layer, which are sequentially stacked, the invention is not limited to the above-described layers constituting the encapsulation layer 114.

Within the encapsulation layer 114, the inorganic layers protect the light emitting element layer 113 from moisture and oxygen, and the organic layer protects the light emitting element layer 113 from foreign substances such as dust particles. The inorganic layers may include a silicon nitride layer, a silicon oxynitride layer, a silicon oxide layer, a titanium oxide layer or an aluminum oxide layer. Although the organic layer may include an acrylic-based organic layer, the invention is not limited thereto.

The sensor layer 120 may be disposed on the display layer 110. The sensor layer 120 may sense an external input applied from outside the display panel 100. In an embodiment, the external input may be a contact, proximity location, light, heat and/or pressure. Such external input may be applied from or by an input tool such as a body portion or a pen.

The sensor layer 120 may be disposed on the display layer 110 through a continuous process. In a continuous process, the sensor layer 120 may be directly disposed on the display layer 110. The expression of being "directly disposed" may represent that a third (intervening) component is not disposed between the sensor layer 120 and the display layer 110. That is, an additional adhesive member as an intervening component may not be disposed between the sensor layer 120 and the display layer 110 to attach these layers to each other.

Alternatively, the sensor layer 120 may be coupled with the display layer 110 through an intervening component such as an adhesive member. The adhesive member may include an adhesive material or sticking agent.

Referring to FIG. 2 again, the upper functional layers may be disposed above the display panel 100. In an embodiment, for example, the upper functional layers (e.g., first functional layers) may include an anti-reflection member 200 and an upper member 300.

The anti-reflection member 200 may reduce a reflectance of external light incident from outside the electronic device 1000. The anti-reflection member 200 may include an elongated synthetic resin film. In an embodiment, for example, the anti-reflection member 200 may be provided by dyeing an iodine compound to a polyvinyl alcohol film ("PVA film"). However, this is merely illustrative, and the invention is not limited to the material of the anti-reflection member 200. The anti-reflection member 200 may have a thickness of about 25 μm to about 35 μm, e.g., about 31 μm. However, the thickness of the anti-reflection member 200 is not limited thereto.

The anti-reflection member 200 may be coupled with the display panel through a first adhesive layer 1010. The first adhesive layer 1010 may be a transparent adhesive layer such as a pressure sensitive adhesive film ("PSA"), an optically clear adhesive film ("OCA") or an optically clear resin ("OCR"). Hereinafter, the adhesive layer may include an adhesive material or sticking agent. The first adhesive layer 1010 may have a thickness of about 20 μm to about 30 μm, e.g., about 25 μm. However, the thickness of the first adhesive layer 1010 is not limited thereto.

In an embodiment, the first adhesive layer 1010 may be omitted. Where the first adhesive layer 1010 is omitted, the anti-reflection member 200 may be directly disposed on the display panel 100 and an additional adhesive layer may not be disposed between the anti-reflection member 200 and the display panel 100.

The upper member 300 may be disposed on the anti-reflection member 200. The upper member 300 may face the display panel 100 with the anti-reflection member 200 therebetween. The upper member 300 may include a first hard coating layer 310, a protection layer 320, a first upper adhesive layer 330, a window 340, a second upper adhesive layer 350, a light shielding layer 360, an impact absorbing layer 370 and a second hard coating layer 380 in order toward the display panel 100. However, the above-described components contained in the upper member 300 are not limited thereto. At least a portion of the above-described components may be omitted, and other components may be added.

The first hard coating layer 310 may be disposed furthest from the display panel 100 and define an outermost surface of the electronic device 1000. The first hard coating layer 310 may be a functional layer for improving a usage property of the electronic device 1000. The first hard coating layer 310 may be applied on the protection layer 320. In an embodiment, for example, an anti-fingerprint property, an anti-pollution property and/or an anti-scratch property of the electronic device 1000 may be improved by the first hard coating layer 310.

The protection layer 320 may be disposed below the first hard coating layer 310. The protection layer 320 may protect components disposed therebelow. The first hard coating layer 310, an anti-fingerprint layer or the like may be additionally provided to the protection layer 320 to improve properties such as chemical resistance or wear resistance. The first hard coating layer 310 may be referred to as a chemical resistance layer or a wear resistance layer. The protection layer 320 may include a film having an elastic modulus of about 15 gigapascals (GPa) or less at a room temperature. The protection layer 320 may have a thickness of about 50 μm to about 60 μm, e.g., about 55 μm. However, the thickness of the protection layer 320 is not limited thereto. In an embodiment, the protection layer 320 may be omitted.

The first upper adhesive layer 330 may be disposed below the protection layer 320. The protection layer 320 and the window 340 may be coupled to each other by the first upper adhesive layer 330. The first upper adhesive layer 330 may have a thickness of about 20 μm to about 30 μm, e.g., about 25 μm. However, the thickness of the first upper adhesive layer 330 is not limited thereto.

The window 340 may be disposed below the first upper adhesive layer 330. The window 340 may include an optically clear insulating material. In an embodiment, for example, the window 340 may include a glass substrate or a synthetic resin film. When the window 340 is the glass substrate, the window 340 may have a thickness of about 80 μm or less, e.g., about 30 μm. However, the thickness of the window 340 is not limited thereto.

When the window 340 is the synthetic resin film, the window 340 may include a polyimide ("PI") film or a polyethylene terephthalate ("PET") film.

The window 340 may have a multilayer structure or a single-layer structure. In an embodiment, for example, the window 340 may include a plurality of synthetic resin films respectively coupled to each other by an adhesive, or a glass substrate and a synthetic resin film which are coupled to each other by an adhesive.

The second upper adhesive layer 350 may be disposed below the window 340. The window 340 and the impact absorbing layer 370 may be coupled to each other by the second upper adhesive layer 350. The second upper adhesive layer 350 may have a thickness of about 30 μm to about 40 μm, e.g., about 35 μm. However, the thickness of the second upper adhesive layer 350 is not limited thereto.

In an embodiment, each of a first sidewall 340S of the window 340 and a second sidewall 350S of the second upper adhesive layer 350 may be disposed at an inner side more than each of a third sidewall 100S of the display panel 100 and a fourth sidewall 320S of the protection layer 320. The feature of being disposed at the inner side may represent a feature of being closer to the active area 1000A than other comparative objects. That is, the display panel 100 and the protection layer 320 extend further from the active area 1000A than the window 340 and the second upper adhesive layer 350

A positional relationship between layers may be varied according to a folding operation of the electronic device 1000. According to an embodiment, since the first sidewall 340S of the window 340 is disposed at an inner side more than each of the third sidewall 100S of the display panel 100 and the fourth sidewall 320S of the protection layer 320, a probability in which the first sidewall 340S of the window 340 protrudes further than the fourth sidewall 320S of the protection layer 320 in folding of the electronic device 1000 may decrease although the position relationship between the layers are varied. Thus, a possibility in which an external impact is transmitted through the first sidewall 340S of the window 340 within the electronic device 1000 which is folded may decrease. As a result, a probability in which a crack is generated in the window 340 within the electronic device 1000 which is folded may decrease.

A first distance 340W between the first sidewall 340S of the window 340 and the fourth sidewall 320S of the protection layer 320 may be equal to or greater than a predetermined distance. Here, the first distance 340W may represent a distance parallel to the first direction DR1. Also, when viewed on a plane, the first distance 340W may correspond to a distance between the first sidewall 340S and the fourth sidewall 320S.

The first distance 340W may be about 180 μm to about 205 μm, e.g., about 196 μm. However, the first distance 340W is not limited thereto. In an embodiment, for example, the first distance 340W may be equal to or greater than about 50 μm or may be about 300 μm. When the first distance 340W increases, the protection layer 320 may protrude further than an end surface of the window 340 to define a protruded portion. The protruded portion may be bent and may be attachable to another component, e.g., a case. Also, as a planar area of the protection layer 320 increases (e.g., parallel to a plane defined by the first direction DR1 and the second direction DR2 crossing each other), a probability in which introduction of foreign substances from an upper portion of the protection layer 320 to a lower portion of the protection layer 320 may decrease.

Also, the window 340 and the second upper adhesive layer 350 may be attached to the impact absorbing layer 370 through a lamination process. Each of the window 340 and the second upper adhesive layer 350 may has a planar area less than that of the impact absorbing layer 370 in consideration of a process tolerance of the lamination process. Also, the second upper adhesive layer 350 may have a planar area less than that of the window 340. In an embodiment, for example, a pressure may be applied to the second upper adhesive layer 350 in a process of attaching the window 340. The second upper adhesive layer 350 may receive the pressure and be stretched in a direction parallel to the first direction DR1 and the second direction DR2. Here, the second upper adhesive layer 350 may have a planar area less than that of the window 340 so that the second upper adhesive layer 350 does not stretch further than the window 340 by pressure applied to the second upper adhesive layer 350.

When the first upper adhesive layer 330 and the second upper adhesive layer 350 are attached, the window 340 may not be slipped during folding of the electronic device 1000 to generate a buckling phenomenon in the window 340. However, according to one or more embodiment, the second upper adhesive layer 350 has a planar area less than a planar area of the window 340. Thus, the first upper adhesive layer 330 may not be undesirably attached to the second upper adhesive layer 350 during attachment of the first upper adhesive layer 330 to the second upper adhesive layer 350, and a probability in which foreign substances are attached to the second upper adhesive layer 350 may decrease.

A second distance 350W between the second sidewall 350S of the second upper adhesive layer 350 and the fourth sidewall 320S of the protection layer 320 may be equal to or greater than a predetermined distance. Here, the second distance 350W may represent a distance parallel to the first direction DR1. Also, when viewed on the plane, the second distance 350W may correspond to a distance between the second sidewall 350S and the fourth sidewall 320S.

The second distance 350W may be about 392 μm. However, the second distance 350W is not limited thereto. In an embodiment, for example, the second distance 350W may be selected in a range from about 292 μm to about 492 μm, without being limited thereto.

The impact absorbing layer 370 may be a functional layer for protecting the display panel 100 from an external impact. The impact absorbing layer 370 may be selected from films each having an elastic modulus of about 1 GPa or more at a room temperature. The impact absorbing layer 370 may be a direction-oriented film having an optical function. In an embodiment, for example, the impact absorbing layer 370 may be an optical axis control film. In an embodiment, for example, the impact absorbing layer 370 may be a biaxially oriented PET film. The impact absorbing layer 370 may have a thickness of about 35 μm to about 45 μm, e.g., about 41 μm. However, the thickness of the impact absorbing layer 370 is not limited thereto. In an embodiment, the impact absorbing layer 370 may be omitted.

The second hard coating layer 380 may be disposed on a surface of the impact absorbing layer 370. The second hard coating layer 380 may include an organic layer, an inorganic layer or an organic-inorganic layer. However, the invention is not limited thereto. In an embodiment, for example, the second hard coating layer 380 may include any of a number of materials which reduce a haze. The haze may be defined as a degree of diffusion of light incident to a test substrate, and a feature of a high haze may represent an opaque unclear phenomenon caused by scattering of light.

Within the impact absorbing layer 370, each of a top surface which is furthest from the display panel 100 and a bottom surface which is closest to the display panel 100 may be curved. The top surface of the impact absorbing layer 370 may contact the second upper adhesive layer 350. Thus, the top surface of the impact absorbing layer 370 may be filled by the second upper adhesive layer 350. Thus, an optical issue (e.g., haze increase) may not be generated in the top surface of the impact absorbing layer 370. The bottom surface of the impact absorbing layer 370 may be flattened or planarized by the second hard coating layer 380. As being in contact, layers or elements may form an interface therebetween.

The light shielding layer 360 may be disposed between the impact absorbing layer 370 and the second upper adhesive layer 350. The light shielding layer 360 may be a printed layer on the top surface of the impact absorbing layer 370. The light shielding layer 360 may overlap or correspond to the peripheral area 1000NA. The light shielding layer 360 may be a colored organic layer provided by a coating method. The light shielding layer 360 may include a polymer resin and a pigment which is in the polymer resin. In an embodiment, for example, the polymer resin may be an acrylic-based resin or polyester, and the pigment may be a carbon-based pigment. However, the material of the light shielding layer 360 is not limited thereto.

The light shielding layer 360 may be provided on the impact absorbing layer 370, such as by printing. Since the impact absorbing layer 370 has a surface that is more curved than that of the second hard coating layer 380, an adhesive force when the light shielding layer 360 is printed on the impact absorbing layer 370 is greater than that when the light shielding layer 360 is printed on the second hard coating layer 380. That is, as the light shielding layer 360 is printed on the curved surface of the impact absorbing layer 370, a probability in which the light shielding layer 360 is separated from the impact absorbing layer 370 may decrease. That is, since a probability in which the light shielding layer 360 is separated from a printing target surface, e.g., the impact absorbing layer 370, decreases, product reliability of the electronic device 1000 may improve.

The upper member 300 may be coupled with the anti-reflection member 200 through a second adhesive layer 1020. The second adhesive layer 1020 may include an adhesive material or sticking agent. The second adhesive layer 1020 may have a thickness of about 20 μm to about 30 μm, e.g., about 25 μm. However, the thickness of the second adhesive layer 1020 is not limited thereto.

The lower functional layers may be disposed below the display panel 100. In an embodiment, for example, the lower functional layers may include a lower protection film 400, a cushion member 500, a first lower member 600, a second lower member 700 and a step compensation member 800 in order from the display panel 100. However, the above-described components contained in the lower functional layers are not limited thereto. At least a portion of the above-described components may be omitted, and other components may be added.

The lower protection film 400 may be coupled to a rear surface of the display panel 100 which is furthest from the upper member 300, through a third adhesive layer 1030. The lower protection film 400 may reduce or effectively prevent scratches from being generated on the rear surface of the display panel 100 in a process of manufacturing the display panel 100. The lower protection film 400 may be a colored polyimide film. In an embodiment, for example, the lower protection film 400 may be an opaque yellow film. However, the invention is not limited thereto. The lower protection film 400 may include at least one anti-static layer. Detailed descriptions thereof will be described later.

The cushion member 500 may be disposed below the lower protection film 400. The cushion member 500 may protect the display panel 100 from an impact transmitted thereto from therebelow. The electronic device 1000 may have an improved impact resistance property by the cushion member 500.

The cushion member 500 may include a first cushion adhesive layer 510, a barrier film 520, a cushion layer 530 and a second cushion adhesive layer 540 in order from the display panel 100. However, the above-described components contained in the cushion member 500 are not limited thereto. At least a portion of the above-described components may be omitted, and other components may be added.

Each of the first cushion adhesive layer 510 and the second cushion adhesive layer 540 may include an adhesive material or sticking agent. The first cushion adhesive layer 510 may be attached to the lower protection film 400, and the second cushion adhesive layer 540 may be attached to the first lower member 600. The first cushion adhesive layer 510 may have a thickness of about 20 μm to about 30 μm, e.g., about 25 μm. The second cushion adhesive layer 540 may have a thickness of about 4 μm to about 15 μm, e.g., about 8 μm. However, the thickness of each of the first cushion adhesive layer 510 and the second cushion adhesive layer 540 is not limited thereto.

The barrier film 520 may be provided to improve an impact resistance performance. The barrier film 520 may serve to prevent the display panel 100 from being deformed. Although the barrier film 520 may be a synthetic resin film, e.g., a polyimide film, the invention is not limited thereto. The barrier film 520 may have a thickness of about 30 μm to about 40 μm, e.g., about 35 μm. However, the thickness of the barrier film 520 is not limited thereto.

The cushion layer 530 may include, e.g., a foam or a sponge. The foam may include a polyurethane foam or a thermoplastic urethane foam. When the cushion layer 530 includes the foam, the cushion layer 530 may be provided by using the barrier film 520 as a base substrate. In an embodiment, for example, the cushion layer 530 may be provided by foaming a foaming agent material on the barrier film 520.

The cushion layer 530 may have a thickness of about 80 µm to about 120 µm, e.g., about 100 µm. However, the thickness of the cushion layer 530 is not limited thereto.

At least one of the barrier film 520 and the cushion layer 530 may have a light absorbing color. In an embodiment, for example, at least one of the barrier film 520 and the cushion layer 530 may have a black color. Where the cushion member 500 in includes a light absorbing material, components disposed below the cushion member 500 may not be visible from outside the electronic device 1000.

The first lower member 600 may be disposed below the cushion member 500. The first lower member 600 may include a plate 610, a lower adhesive layer 620 and a cover layer 630 in order from the cushion member 500. However, the above-described components contained in the first lower member 600 are not limited thereto. At least a portion of the above-described components may be omitted, and other components may be added.

The plate 610 may include a material having an elastic modulus of about 60 GPa or more at room temperature. In an embodiment, the plate 610 may include a material such as SUS304, but is not limited thereto. The plate 610 may support components disposed thereabove. Also, the electronic device 1000 may have an improved heat dissipation performance by the plate 610. The plate 610 and/or the first lower member 600 may define a heat dissipating layer.

An opening 611 may be defined in a portion of the plate 610. The opening 611 may be provided in plural including a plurality of openings. The opening 611 may be defined in an area of the plate 610 which overlaps or corresponds to the second area 1000A2. On a plane, e.g., when viewed in the third direction DR3, the opening 611 may overlap or be aligned with the second area 1000A2. The opening 611 may allow a portion of the plate 610 to be easily deformable.

The cover layer 630 may be attached to the plate 610 by the lower adhesive layer 620. The lower adhesive layer 620 may include an adhesive material or sticking agent. The cover layer 630 may cover the opening 611 of the plate 610. Thus, the cover layer 630 may additionally reduce or effectively prevent foreign substances from being introduced to the opening 611 from outside thereof.

The cover layer 630 may include a material having an elastic modulus lower than that of the plate 610. In an embodiment, for example, the cover layer 630 may include a thermoplastic polyurethane. However, the invention is not limited thereto.

The plate 610 may have a thickness of about 120 µm to about 180 µm, e.g., about 150 µm. The lower adhesive layer 620 may have a thickness of about 4 µm to about 15 µm, e.g., about 8 µm. The cover layer 630 may have a thickness of about 4 µm to about 15 µm, e.g., about 8 µm. However, the thickness of the plate 610, the thickness of the lower adhesive layer 620 and the thickness of the cover layer 630 are not limited to the above-described values.

The second lower member 700 may be provided in plural including second lower members 700. The second lower members 700 may be disposed below the first lower member 600. Each of the second lower members 700 may face the cushion member 500 with the first lower member 600 therebetween, The second lower members 700 may be spaced apart from each other. The second lower members 700 may be disconnected from each other at the second area 1000A2. In an embodiment, for example, one of the second lower member 700 may be disposed corresponding to the first area 1000A1, and another one of the second lower member 700 may be disposed corresponding to the third area 1000A3.

Each of the second lower member 700 may be attached to the first lower member 600 by a fourth adhesive layer 1040 (e.g., fourth adhesive pattern) to include fourth adhesive layers 1040. For example, a first one of the fourth adhesive layer 1040 may be attached to a bottom surface of the first lower member 600 overlapping the first area 1000A1, and a second one of the fourth adhesive layer 1040 may be attached to the bottom surface of the first lower member 600 overlapping the third area 1000A3. That is, the fourth adhesive layers 1040 may not overlap the second area 1000A2, such as to be outside of the second area 1000A2. Each of the fourth adhesive layers 1040 may have a thickness of about 8 µm to about 15 µm, e.g., about 8 µm. However, the thickness of each of the fourth adhesive layers 1040 is not limited thereto.

Although not shown, a step compensating film may be further provided between the first lower member 600 and each of the second lower members 700. In an embodiment, for example, the step compensating film may be disposed corresponding to the second area 1000A2. An adhesive force of one surface of the step compensating film may be less than an adhesive force of another surface which is opposite to the one surface. In an embodiment, for example, the one surface may not have an adhesive force. The one surface may face the first lower member 600 to be closest to the first lower member 600.

Each of the second lower members 700 may include a lower plate 710, a heat dissipation sheet 720 and an insulation film 730. However, the above-described components contained in each of the second lower members 700 are not limited thereto. At least a portion of the above-described components may be omitted, and other components may be added.

The lower plate 710 may be provided in plurality including lower plates 710. One of the lower plates 710 may overlap or correspond to the first area 1000A1 and a first portion of the second area 1000A2, and the other of the lower plates 710 may overlap or correspond to a second portion of the second area 1000A2 and the third area 1000A3.

The lower plates 710 may be spaced apart from (e.g., disconnected from) each other at the second area 1000A2. However, the lower plates 710 may be disposed maximally adjacent to each other (e.g., minimum space between the lower plates 710) to support the area at which the opening 611 of the plate 610 is defined. In an embodiment, for example, the lower plates 710 may reduce or effectively prevent a shape of the area in which the opening 611 of the plate 610 is defined from being deformed by a pressure applied from thereabove.

Also, the lower plates 710 may serve to reduce or effectively prevent shapes of components disposed on the second lower members 700 from being deformed by components disposed below the second lower members 700.

Each of the lower plates 710 may include a metal alloy, e.g., a copper alloy. However, the material of the lower plates 710 is not limited thereto. Each of the lower plates 710 may have a thickness of about 60 µm to about 100 µm, e.g., about 80 µm. However, the thickness of each of the lower plates 710 is not limited thereto.

The heat dissipation sheet 720 may be attached to a lower portion of the lower plate 710. The heat dissipation sheet 720 may be a thermally conductive sheet having a high thermal conductivity. In an embodiment, for example, the heat dissipation sheet 720 may include a heat dissipation layer 721, a first heat dissipation adhesive layer 722, a second heat dissipation adhesive layer 723 and a gap tape 724 (e.g., gap member).

The gap tape 724 may be attached to the first heat dissipation adhesive layer 722 and the second heat dissipation adhesive layer 723 which are spaced apart from each other with the heat dissipation layer 721 therebetween. The gap tape 724 may be provided in plural within a same one of the second lower member 700. The gap tape 724 may include a plurality of layers. In an embodiment, for example, the gap tape 724 may include a substrate layer, a top adhesive layer disposed on a top surface of the substrate layer, and a bottom adhesive layer disposed on a bottom surface of the substrate layer.

The heat dissipation layer 721 may be attached to the lower plate 710 by the first heat dissipation adhesive layer 722. The heat dissipation layer 721 may be sealed by the first heat dissipation adhesive layer 722, the second heat dissipation adhesive layer 723 together with the gap tape 724. The heat dissipation layer 721 may be a graphitized polymer film. The polymer film may be, e.g., a polyimide film. Each of the first heat dissipation adhesive layer 722 and the second heat dissipation adhesive layer 723 may have a thickness of about 3 μm to about 8 μm, e.g., about 5 μm. Each of the heat dissipation layer 721 and the gap tape 724 may have a thickness of about 10 μm to about 25 μm, e.g., about 17 μm. However, the thickness of each of the first heat dissipation adhesive layer 722, the second heat dissipation adhesive layer 723 and the gap tape 724 are not limited to the above-described values.

The insulation film 730 may be attached to a lower portion of the heat dissipation sheet 720. In an embodiment, for example, the insulation film 730 may be attached to the heat dissipation sheet 720 at the second heat dissipation adhesive layer 723. The insulation film 730 may reduce or effectively prevent rattle from being generated in the electronic device 1000. Although the insulation film 730 may have a thickness of about 15 μm, the invention is not limited thereto.

The step compensation member 800 may be attached to a lower portion of the plate 610. In an embodiment, for example, the lower adhesive layer 620 may be attached to a first lower portion of the plate 610, and the step compensation member 800 may be attached to a second lower portion of the plate 610. The first lower portion of the plate 610 may be closer to the second area 1000A2 than the second lower portion of the plate 610.

The step compensation member 800 may include a first compensation adhesive layer 810, a step compensation film 820 and a second compensation adhesive layer 830. The first compensation adhesive layer 810 may be attached to a bottom surface of the plate 610. The step compensation film 820 may be a synthetic resin film. The second compensation adhesive layer 830 may be attached to a bottom surface of the step compensation film 820 and a set (not shown). Each of the first compensation adhesive layer 810 and the second compensation adhesive layer 830 may have a thickness of about 13 μm to about 25 μm, e.g., about 17 μm. However, the thickness of each of the first compensation adhesive layer 810 and the second compensation adhesive layer 830 are not limited thereto. In an embodiment, for example, a thickness of the step compensation film 820 may be determined by the thickness of each of the first compensation adhesive layer 810 and the second compensation adhesive layer 830.

Figure 3B:
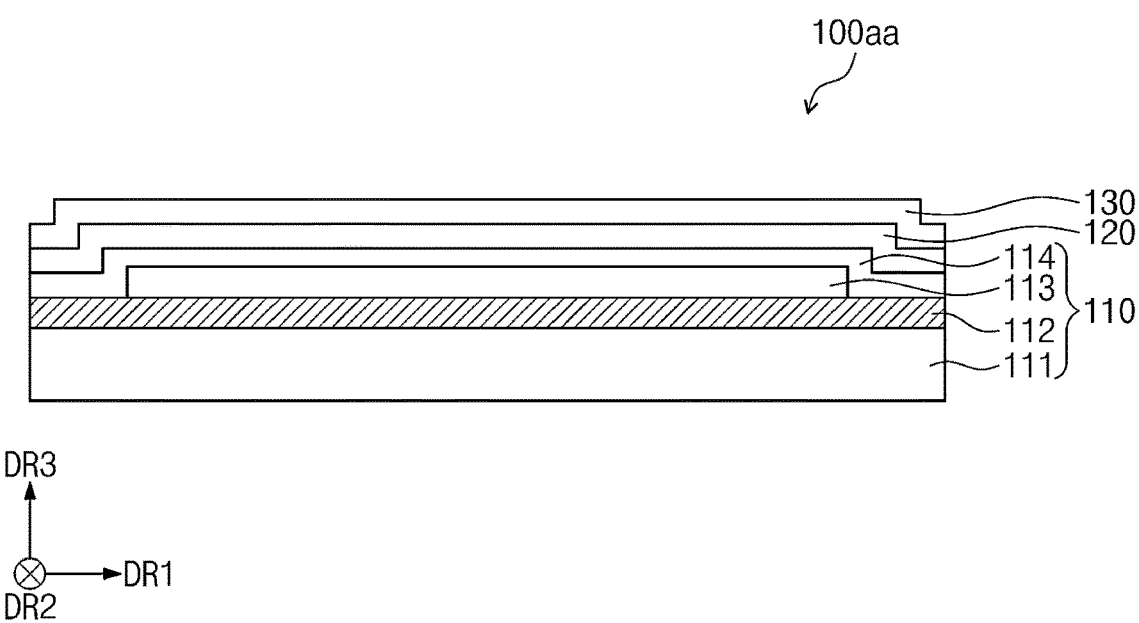
FIG. 3B is a cross-sectional view of an embodiment of a display panel.

FIG. 3B is a cross-sectional view of an embodiment of a display panel 100aa.

Referring to FIG. 3B, a display panel 100aa may further include an anti-reflection layer 130 when compared with the display panel 100 described in FIG. 3A. Where the display panel 100aa includes the anti-reflection layer 130, the electronic device 1000 (refer to FIG. 2) including the display panel 100aa may omit the anti-reflection member 200 (refer to FIG. 2) and the first adhesive layer 1010 (refer to FIG. 2).

The display panel 100aa may include a display layer 110, a sensor layer 120 and an anti-reflection layer 130.

The anti-reflection layer 130 may include color filters. The color filters may have a predetermined arrangement. The arrangement of the color filters may be determined in consideration of light emitting colors of pixels of the display layer 110 at which an image is displayed, light is emitted, light is generated, etc. Also, the anti-reflection layer 130 may further include a black matrix disposed adjacent to the color filters.

The anti-reflection layer 130 may include a destructive interference structure. In an embodiment, for example, the destructive interference structure may include a first reflection layer and a second reflection layer which are disposed in different layers from each other. First reflected light and second reflected light which are reflected from the first reflection layer and the second reflection layer, respectively, may be destructively interfered with each other, and thus a reflectance of external light may decrease.

Figure 4:
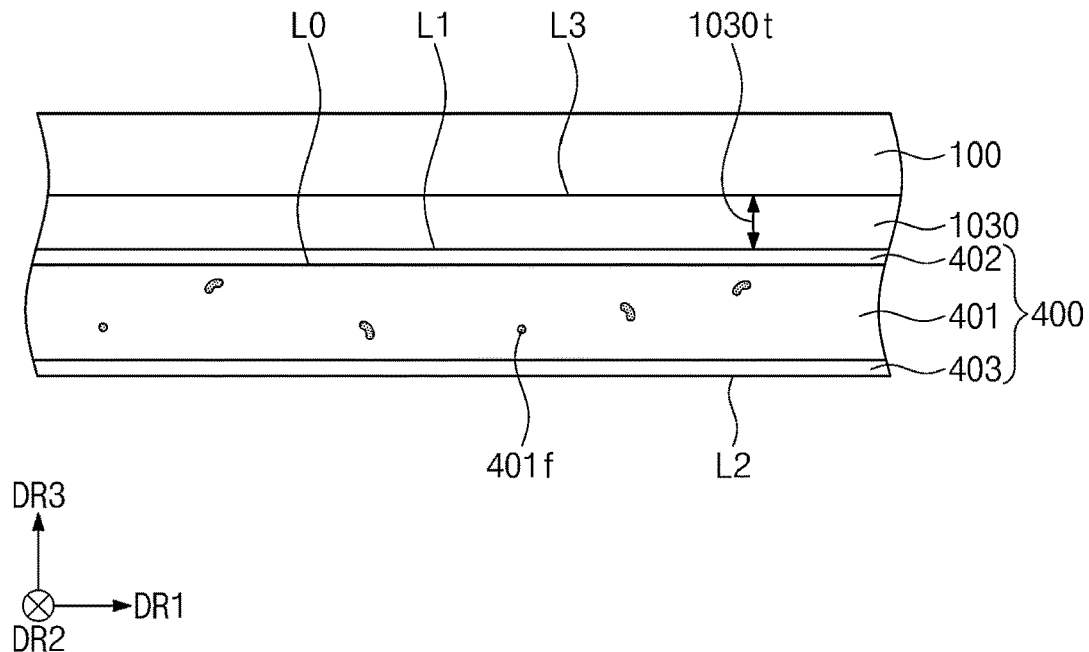
FIG. 4 is an enlarged cross-sectional view illustrating an embodiment of a protection film relative to an adhesive layer and a display panel.

FIG. 4 is an enlarged cross-sectional view illustrating an embodiment of a lower protection film 400 relative to a display panel 100 of an electronic device 1000.

Referring to FIG. 4, the display panel 100, the third adhesive layer 1030 and the lower protection film 400 are illustrated. Hereinafter, the third adhesive layer 1030 may be referred to as an adhesive layer, and the lower protection film 400 may be referred to as a protection film.

The lower protection film 400 may include a first surface L1 and a second surface L2. The first surface L1 may form an interface with the third adhesive layer 1030, and the second surface L2 may be opposite to the first surface L1. The second surface L2 may form an interface with the first cushion adhesive layer 510 (refer to FIG. 2). The first surface L1 and the second surface L2 may define an outer surface of the lower protection film 400.

The lower protection film 400 may include a base film 401 (e.g., first base film) and an anti-static layer provided in plurality including a first anti-static layer 402 and a second anti-static layer 403. The first anti-static layer 402 may be disposed on one surface of the base film 401, and the second anti-static layer 403 may be disposed on another surface of the base film 401 which is opposite to the one surface. The first anti-static layer 402 and the second anti-static layer 403 may be spaced apart from each other with the base film 401 therebetween. That is, the first anti-static layer 402 may face the second anti-static layer 403 with the base film 401 therebetween. The first anti-static layer 402 may define the first surface L1 and the second anti-static layer 403 may define the second surface L2. That is, the first anti-static layer 402 and the second anti-static layer 403 may define outer surfaces of the lower protection film 400.

The base film 401 may be a polyimide film. The base film 401 may include biphenyl-tetracarboxylic acid dianhydride (hereinafter, referred to as BPDA). Flexibility of the base film 401 may be adjusted by adjusting an amount of BPDA contained in the base film 401. Also, a color of the base film 401 may be adjusted by adjusting the amount of BPDA contained in the base film 401. The color adjustment is related to transparency of the base film 401.

In an embodiment, for example, a flexibility when the base film 401 includes pyromellitic dianhydride (hereinafter, referred to as PMDA), BPDA and diaminodiphenyl ether (hereinafter, referred to as ODA) in a mole ratio of about 0.75:0.25:1 is less than a flexibility when the base film 401 includes BPDA and ODA in a mole ratio of about 1:1. As a weight ratio occupied by BPDA in the base film 401 increases, the flexibility of the base film 401 may gradually increase. In an embodiment, for example, when a content of BPDA in the base film 401 increases, each of an elastic modulus and a plastic modulus of the base film 401 increases and a viscoelastic recovery rate thereof also increases.

In an embodiment, for example, when the base film 401 includes BPDA and ODA in a mole ratio of about 1:1, the base film 401 may have a pale yellow color. Also, when the base film 401 includes BPDA, benzophenonetetracarboxylic dianhydride ("BTDA") and ODA in a mole ratio of about 0.5:0.5:1, the base film 401 may have a dark yellow color. That is, when the content of BPDA in the base film 401 increases, a transmittance of the base film 401 may further increase.

In order to increase the transmittance of the base film 401, a temperature and/or a time of a heat treatment process may be adjusted when the base film 401 is provided or manufactured. In an embodiment, for example, when the base film 401 is heat-treated, the base film 401 a color thereof may become darker. Thus, the time of the heat treatment process of the base film 401 may be reduced and/or the temperature of the heat treatment may be reduced.

Figure 5:
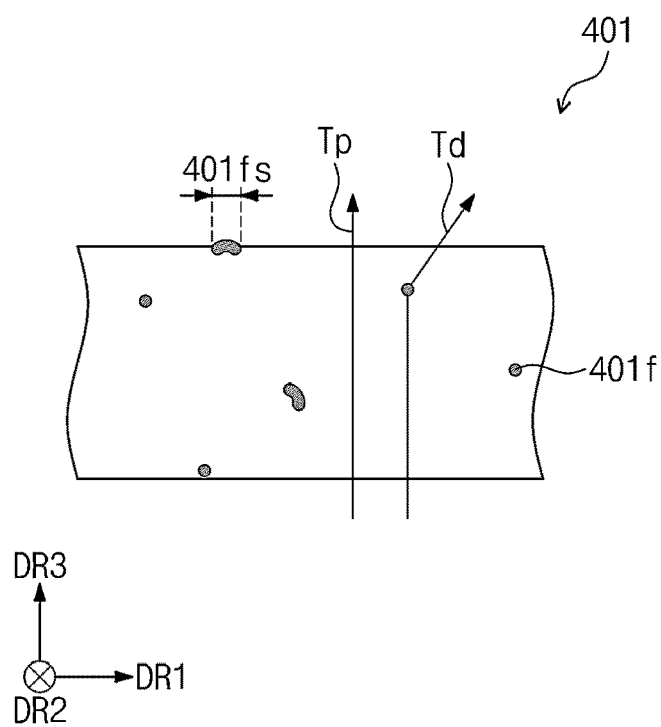
FIG. 5 is an enlarged cross-sectional view illustrating an embodiment of a base film.

FIG. 5 is an enlarged cross-sectional view illustrating an embodiment of a base film 401 of a lower protection film 400 of an electronic device 1000.

Referring to FIGS. 4 and 5, the base film 401 may further include a filler 401f within a base material. The filler 401f may have a size 401fs of about 0.5 μm or more to about 2 μm or less, e.g., about 1 μm. The filler 401f may have an amorphous shape or a circular shape. When the filler 401f has the amorphous shape, the size 401fs of the filler 401f may be defined as a maximum dimension (e.g., width) of the filler 401f. When the filler 401f has the circular shape, the size 401fs of the filler 401f may be a diameter thereof.

The filler 401f may be referred to as an anti-blocking agent or anti-blocking material, where blocking may represent a phenomenon in which adjacent films are attached to each other. The filler 401f may serve to reduce or effectively prevent the base film 401 from being attached to itself when portions of the base film 401 contact each other such as from winding thereof around a roll. The filler 401f may allow the base film 401 to have a rough surface and prevent portions of the base film 401 facing each other from being attached to each other by defining a space between the facing portions of the base film 401. The rough surface may be an outer surface of the base film 401. The filler 401f may include silica, diatomite, kaolin or talc. However, the material of the filler 401f is not limited thereto.

TABLE 1

| Category | Comparative example | | | Embodiment | | |
|---|---|---|---|---|---|---|
| Size of foreign substance (μm, micrometer) | 70 or more 100 or less | 100 or more 140 or less | 140 or more | 70 or more 100 or less | 100 or more 140 or less | 140 or more |
| Number of foreign substance (each) | 1.09 | 0.34 | 0.42 | 0.58 | 0.16 | 0.28 |
| Sum | | 1.85 | | | 1.03 | |

Table 1 shows the number of foreign substances per 1 meter squared ($m^2$) calculated for each of sections with respect to sizes of foreign substances in the base film 401. The filler 401f in the base film 401 may be agglomerated in a manufacturing process, and when the agglomerated filler has a size equal to or greater than a predetermined size, the agglomerated filler may be defined as a foreign substance.

The Comparative example represents a comparative base film including a comparative filler having a size of about 3 μm to about 4 μm, and the Embodiment represents the base film 401 including the filler 401f having a size of about 1 μm. In Table 1, the sum of foreign substances is about 1.85 for the Comparative example and about 1.03 for the Embodiment. Thus, a reduction effect of about 44% is exhibited. That is, as the size 401fs of the filler 401f decreases, the number of the foreign substances contained in the base film 401 as agglomerated filler may decrease.

The size 401fs of the filler 401f may affect a transmittance and a haze of the base film 401. The base film 401 may have a transmittance equal to or greater than about 50% and less than about 100%, e.g., about 56%. The base film 401 may have a haze equal to or less than about 6% and equal to or greater than 0%, e.g., equal to or less than about 5%.

The transmittance of the base film 401 may be defined as a sum of a front transmittance Tp and a side transmittance Td, and the haze of the base film 401 may be a value expressed in percentage (%) obtained by dividing the front transmittance Tp by the sum of the front transmittance Tp and the side transmittance Td.

Figure 6A:
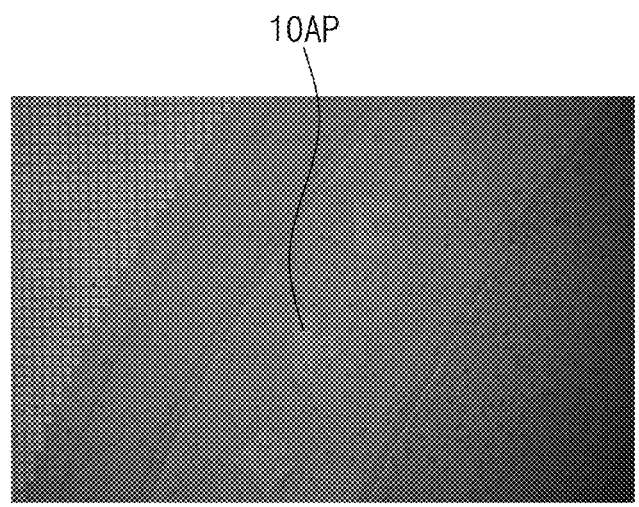
FIG. 6A is a photograph of a comparative electronic device.
Figure 6B:
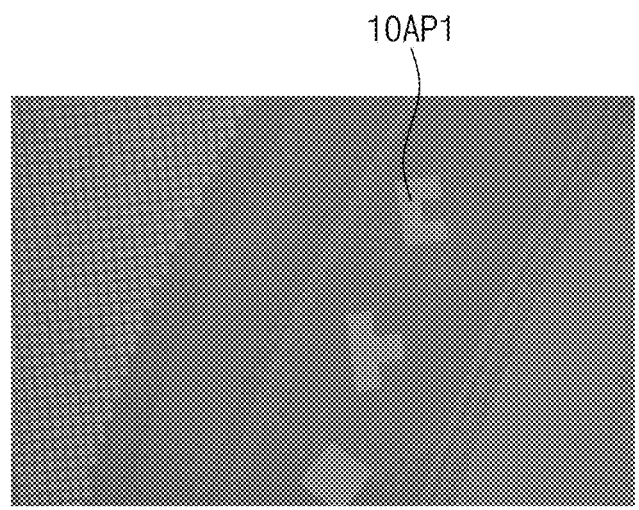
FIG. 6B is a photograph of an embodiment of an electronic device.

FIG. 6A is a photograph of a comparative electronic device according to the Comparative example. FIG. 6B is a photograph of an embodiment of the electronic device 1000 according to the Embodiment.

FIG. 6A is a photograph obtained by photographing a portion of the Comparative electronic device when the comparative filler contained in the comparative base film has a comparative size of about 3 μm to about 4 μm. FIG. 6B is a photograph obtained by photographing a portion of the electronic device 1000 (refer to FIG. 1A) when the filler 401f (refer to FIG. 5) contained in the base film 401 (refer to FIG. 5) has the size 401fs (refer to FIG. 5) of about 1 μm.

As the size 401fs (refer to FIG. 5) of the filler 401f (refer to FIG. 5) decreases, a dispersibility of the filler 401f may improve, and thus the transmittance of the base film 401 (refer to FIG. 5) may increase. Referring to FIGS. 6A and 6B, a difference according to the size 401*fs* (refer to FIG. 5) of the filler 401*f* (refer to FIG. 5) may be shown. The comparative base film in FIG. 6A has a transmittance of about 41% and a haze of about 11%, and the base film 401 (refer to FIG. 5) in FIG. 6B has a transmittance of about 56% and a haze of about 5% to about 6%.

An alignment pattern 10AP1 in FIG. 6B is shown more clearly than a comparative alignment pattern 10AP in FIG. 6A. Thus, as the size 401*fs* (refer to FIG. 5) of the filler 401*f* (refer to FIG. 5) decreases, the alignment pattern 10AP1 may be more clearly visible from outside the stacked structure, and thus an alignment process may be further easily performed.

Figure 7:
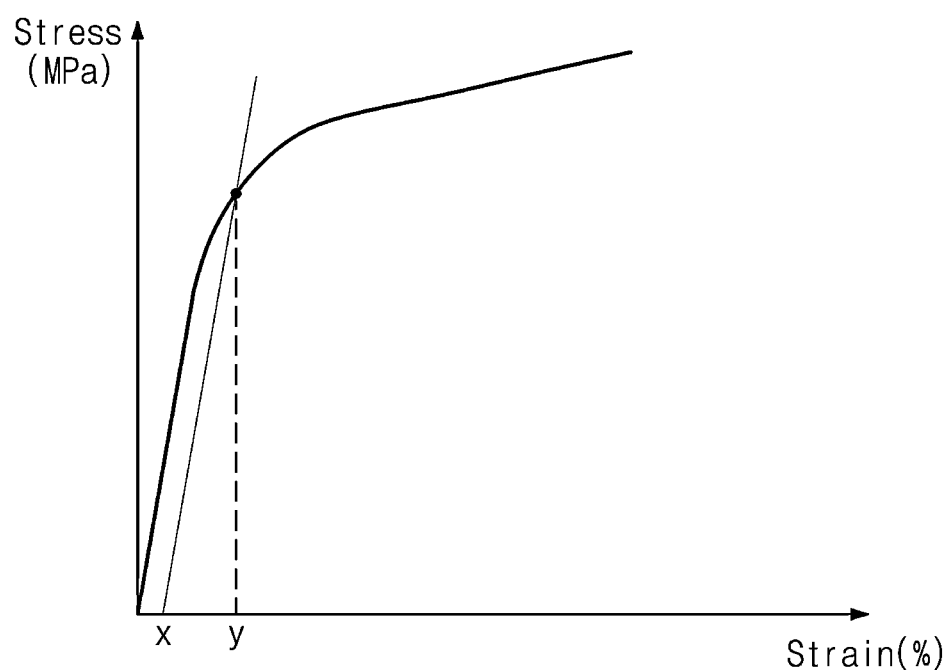
FIG. 7 is a graph illustrating a stress-strain curve of an embodiment of a base film.

FIG. 7 is a graph illustrating a stress-strain curve of an embodiment of the base film 401. Stress in megapascals (MPa) and strain in percent (%) may be measured and graphed by using a universal testing machine.

Referring to FIGS. 4 and 7, the base film 401 may have a yield point of about 1.5% or more. In an embodiment, for example, when an elastic region expressed by a linear section is shifted as many as about x % in the stress-strain curve, a yield strength y % of x % offset crossing the stress-strain curve may be about 1.5 or more. In FIG. 7, x is about 0.05 to about 0.5.

As the base film 401 has the yield point of about 1.5% or more, a probability of shape deformation of the base film 401 may decrease although the base film 401 is repeatedly folded and unfolded. Thus, wrinkle generation caused by the shape deformation of the base film 401 may decrease.

Referring to FIG. 4 again, the first anti-static layer 402 and the second anti-static layer 403 may be applied to opposing surfaces of the base film 401, respectively. Each of the first anti-static layer 402 and the second anti-static layer 403 may include a urethane-based binder and an anti-static agent. In an embodiment, for example, each of the first anti-static layer 402 and the second anti-static layer 403 may include urethane or urethane acrylate. Each of the first anti-static layer 402 and the second anti-static layer 403 may further include isocyanate. Although the anti-static agent may be poly(3,4-ethylenedioxythiophene) polystyrene sulfonate ("PEDOT:PSS"), the invention.

The base film 401 may be a polyimide film. Since the polyimide film has a flexible property more than a polyethylene terephthalate film, the polyimide film may have a better folding characteristic. However, the polyimide film may have a surface energy less than the polyethylene terephthalate film. As the surface energy decreases, an uncoated phenomenon is easily generated during a coating process, and coating reliability is hardly secured. However, according to one or more embodiment, each of the first anti-static layer 402 and the second anti-static layer 403 may include a urethane-based binder and an anti-static agent which is in the urethane-based binder. The urethane-based binder may have NCO coupling, and the first anti-static layer 402 and the second anti-static layer 403 may be uniformly applied on a polyimide film by the NCO coupling. Thus, the coating reliability of each of the first anti-static layer 402 and the second anti-static layer 403 may improve.

The third adhesive layer 1030 may be disposed on the first anti-static layer 402. The third adhesive layer 1030 may include a polymer resin including a silicon-based resin, an acrylic-based resin or a urethane-based resin. The kind of the third adhesive layer 1030 satisfying the folding characteristic may be restricted unlike a coating solution of the first anti-static layer 402. The third adhesive layer 1030 may be applied on the first anti-static layer 402. A composition of the coating solution of the first anti-static layer 402 may be adjusted differently from a property of the third adhesive layer 1030 so that the third adhesive layer 1030 is uniformly applied on the first anti-static layer 402.

TABLE 2

| Category | Surface energy (mN/m) | Dispersion energy | Polar surface energy (mN/m) | Anti-static layer coatability | Adhesive layer coatability |
|---|---|---|---|---|---|
| Comparative example 1 | 29.6 | 29.5 | 0.08 | Poor | Poor |
| Comparative example 2 | 42.99 | 38.26 | 4.73 | Satisfactory | Poor |
| Comparative example 3 | 42.92 | 37.84 | 5.08 | Satisfactory | Poor |
| Embodiment 1 | 39.15 | 29.86 | 12.29 | Satisfactory | Satisfactory |
| Embodiment 2 | 42.2 | 29.4 | 12.8 | Satisfactory | Satisfactory |
| Embodiment 3 | 42.3 | 28.6 | 13.7 | Satisfactory | Satisfactory |

In Table 2, the term "Poor" in a respective anti-static layer coatability represents generation of an uncoated phenomenon in which the first anti-static layer 402 is not sufficiently applied to the base film 401, and the term "Poor" in respective adhesive layer coatability represents generation of an uncoated phenomenon in which the third adhesive layer 1030 is not sufficiently applied to the first anti-static layer 402. Referring to results of Table 2, the polar surface energy of the first anti-static layer 402 may be adjusted by adjusting the composition of the coating solution. In an embodiment, for example, the composition of the coating solution may be adjusted by adjusting a content of a binder the coating solution of the first anti-static layer 402, e.g., a urethane-based binder.

The polar surface energy of the first anti-static layer 402 which is required for satisfactorily applying the third adhesive layer 1030 on the first anti-static layer 402, may be about 6 millinewtons/meter (mN/m) or more and about 22 mN/m or less. However, this is merely illustrative, and the invention is not limited to the above-described upper bound of about 22 mN/m of the polar surface energy. Referring to the Comparative examples 1, 2, and 3 in the table 2, the "Poor" of the adhesive layer coatability is generated when the polar surface energy of the first anti-static layer 402 is less than about 6 mN/m. That is, the third adhesive layer 1030 may not be sufficiently applied on the first anti-static layer 402.

Referring to the Comparative examples 1, 2, and 3 in Table 2, the polar surface energy of the first surface L1 may be about 12 mN/m or more and the third adhesive layer 1030 may be satisfactorily applied on the first anti-static layer 402.

A third surface L0 (refer to FIG. 4) of the base film 401 may have a surface resistance (or sheet resistance) of about $10^{12}$ Ohms square (($\Omega/\square$)) or more. The third surface L0 may be an outer surface of the base film 401. When the first anti-static layer 402 is provided such as by coating, a surface resistance of the first surface L1 of the lower protection film 400 may decrease more than that of the third surface L0 of the base film 401. That is, within the lower protection film 400, the surface resistance of the first surface L1 of the lower protection film 400 may be lower than the surface resistance of the third surface L0 of the base film 401. In an embodiment, providing of the first anti-static layer 402 on the base film 401 decreases the surface resistance of the first surface L1 of the lower protection film 400 to define the surface resistance of the first surface L1 which is lower than the surface resistance of the third surface L0 of the base film 401.

Thereafter, when the third adhesive layer 1030 is attached to the first anti-static layer 402 at the first surface L1, a surface resistance of a fourth surface L3 of the third adhesive layer 1030 may increase more than that of the first surface L1. That is, within the lower protection film 400, the surface resistance of the fourth surface L3 of the third adhesive layer 1030 may be greater than the surface resistance of the first surface L1 of the lower protection film 400. In an embodiment, providing of the third adhesive layer 1030 on the first anti-static layer 402 increases the surface resistance of the fourth surface L3 of the third adhesive layer 1030 to define the surface resistance of the fourth surface L3 which is greater than the surface resistance of the first surface L1 of the lower protection film 400.

The surface resistance of the first surface L1 is less than a predetermined value to maintain an anti-static function of the first anti-static layer 402. In an embodiment, for example, the surface resistance of the first surface L1 of the first anti-static layer 402 may be about $10^6 \Omega/\square$ or less.

In an embodiment, for example, the third adhesive layer 1030 may have a layer thickness 1030$t$ of about 10 μm or more and about 25 μm or less. When the layer thickness 1030$t$ of the third adhesive layer 1030 is about 10 μm, the surface resistance of the fourth surface L3 of the third adhesive layer 1030 may be about $10^9 \Omega/\square$ or more and about $10^{10} \Omega/\square$ or less, and when the layer thickness 1030$t$ of the third adhesive layer 1030 is about 25 μm, the surface resistance of the fourth surface L3 of the third adhesive layer 1030 may be about $10^{10} \Omega/\square$ or more and about $10^{11} \Omega/\square$ or less. Thus, as the surface resistance of the first anti-static layer 402 is equal to or less than a predetermined value, the first anti-static layer 402 may have a sufficient anti-static function although the third adhesive layer 1030 is attached to the first anti-static layer 402.

When an anti-static agent is added to the third adhesive layer 1030, the folding characteristic of the electronic device 1000 (refer to FIG. 1A) may be varied due to property variation of the third adhesive layer 1030. However, according to one or more embodiment, although the anti-static agent is added to the third adhesive layer 1030, the anti-static function may be provided by the first anti-static layer 402 attached below the third adhesive layer 1030. Thus, the electronic device 1000 (refer to FIG. 1A) including the lower protection film 400 may have reduced defects caused by electrostatic damage and also maintain the folding characteristic.

The surface resistance is expressed by a value obtained by measuring a surface of a measurement target with a resistance measuring instrument. The surface resistance may be a value obtained by measuring at least four points with a surface resistance measuring instrument and calculating an average thereof.

Table 3 shows the number of foreign substances per 1 meter squared (m²) calculated for each of sections of sizes of foreign substances in the lower protection film 400 after the first anti-static layer 402 and the second anti-static layer 403 are provided on the base film 401. The Comparative example in Table 3 represents a comparative protection film including a comparative base film including a comparative filler having a comparative size of about 3 μm to about 4 μm, and the Embodiment represents the lower protection film 400 including the base film 401 including the filler 401$f$ having a size 401$fs$ of about 1 μm. The sum of foreign substances is about 4.85 in the Comparative example and about 2.75 in the Embodiment. Thus, a reduction effect of about 49% is exhibited. That is, as the size 401$fs$ (refer to FIG. 5) of the filler 401$f$ decreases, the number of the foreign substances contained in the lower protection film 400 may decrease.

Figure 8:
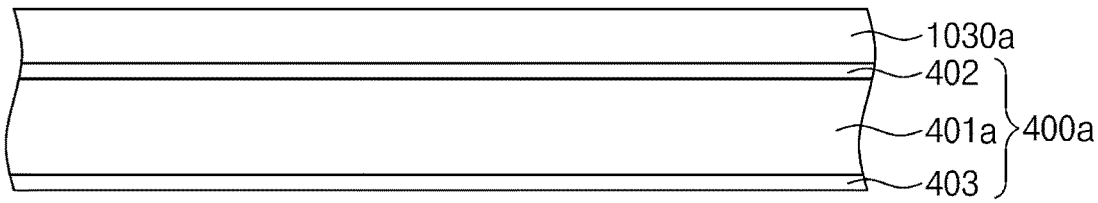
FIG. 8 is an enlarged cross-sectional view illustrating an embodiment of a protective film and an adhesive layer.
Figure 8:
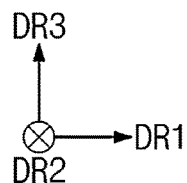

FIG. 8 is an enlarged cross-sectional view illustrating an embodiment of a lower protection film 400$a$. In describing FIG. 8, the same components as those described in FIG. 4 will be designated by the same reference symbols, respectively, and descriptions thereof will be omitted.

Referring to FIG. 8, a third adhesive layer 1030$a$ and a lower protection film 400$a$ are illustrated. Hereinafter, the third adhesive layer 1030$a$ may be referred to as an adhesive layer, and the lower protection film 400$a$ may be referred to as a protection film.

The lower protection film 400$a$ may include a base film 401$a$, a first anti-static layer 402 and a second anti-static layer 403. The first anti-static layer 402 and the second anti-static layer 403 may be spaced apart from each other with the base film 401$a$ therebetween. The first anti-static layer 402 may directly contact the third adhesive layer 1030$a$, such as to form an interface therebetween.

In an embodiment, at least one of the base film 401$a$ and the third adhesive layer 1030$a$ may further include an anti-static agent. In an embodiment, for example, the anti-static agent may be provided from an anti-static material including at least one of a metal-based compound and an ionic liquid material. In an embodiment, for example, the anti-static agent may include at least one of PEDOT: PSS, CNT, $Sb_2O_5$, $SnO_2$, ammonium ($NH^{4+}$), phosphonium ($PH^{4+}$), immidazolluim, pyridinium and lithium-ion ($Li^+$).

Figure 9:
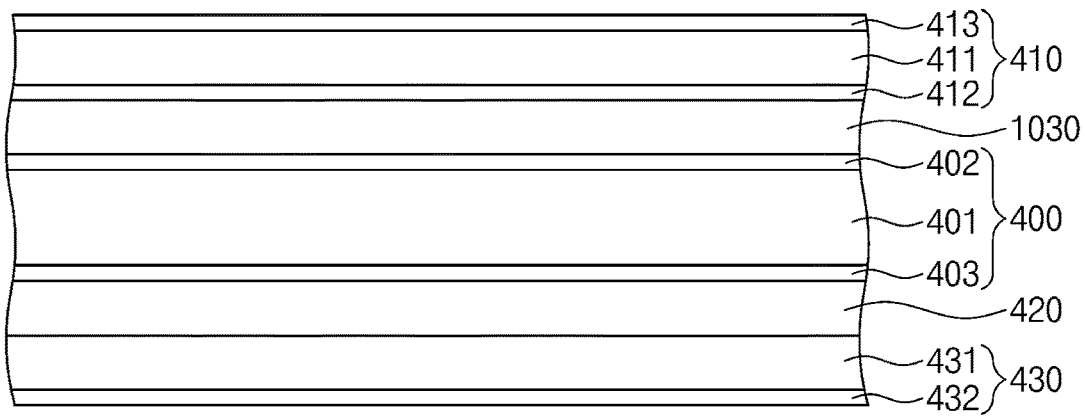
FIG. 9 is an enlarged cross-sectional view of an embodiment of a protection member.
Figure 9:
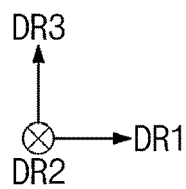

FIG. 9 is an enlarged cross-sectional view of an embodiment of a protection member 4000.

Referring to FIG. 9, a protection member 4000 may include a lower protection film 400, a third adhesive layer 1030, a release film 410, an intermediate adhesive layer 420 and a carrier film 430.

The third adhesive layer 1030 may be attached to the release film 410 and the lower protection film 400, and the intermediate adhesive layer 420 may be attached to the lower protection film 400 and the carrier film 430. The third

TABLE 3

| Category | Comparative example | | | Embodiment | | |
|---|---|---|---|---|---|---|
| Size of foreign substance (μm, micrometer) | 70 or more 100 or less | 100 or more 140 or less | 140 or more | 70 or more 100 or less | 100 or more 140 or less | 140 or more |
| Number of foreign substance (ea) | 1.23 | 2.62 | 1 | 0.59 | 1.01 | 0.64 |
| Sum | 4.85 | | | 2.47 | | | adhesive layer 1030 may have an adhesive force greater than that of the intermediate adhesive layer 420.

The release film 410 may include a second base film 411, a third anti-static layer 412 and a fourth anti-static layer 413. The second base film 411 may be a polyethylene terephthalate film. Each of the third anti-static layer 412 and the fourth anti-static layer 413 may be an anti-static coating layer including an anti-static agent. The third anti-static layer 412 may be applied to a bottom surface of the second base film 411, and the fourth anti-static layer 413 may be applied to a top surface of the second base film 411.

The carrier film 430 may include a third base film 431 and a fifth anti-static layer 432. The fifth anti-static layer 432 may be applied to a bottom surface of the third base film 431. Thus, the fifth anti-static layer 432 may face the intermediate adhesive layer 420 with the third base film 431 therebetween.

The protection member 4000 may define a preliminary structure including the lower protection film 400. The release film 410 and the carrier film 430 may be removably attached to the lower protection film 400. The lower protection film 400 having the release film 410 and the carrier film 430 removed therefrom is attachable to other layers of the electronic device 1000 (refer to FIGS. 2 and 4), such as by an adhesive layer.

According to one or more embodiment, the lower protection film 400 attached to the rear surface of the display panel 100 may include the base film 401 and anti-static layers disposed on opposing surfaces of the base film 401, respectively. The base film 401 may include BPDA and the filler 401f having the size of about 1 μm. Thus, the base film 401 may have the improved folding characteristic and the increased transmittance. Also, each of the anti-static layers may have the improved coating reliability by including the urethane-based binder.

Also, according to one or more embodiment, each of the anti-static layers may have the surface resistance equal to or less than a predetermined value. Thus, the anti-static function of the anti-static layers may be maintained although the adhesive layer is attached to both the display panel 100 and the anti-static layer. Also, each of the anti-static layers may have the polar surface energy equal to or greater than a predetermined value. Thus, the adhesive layer including a material which is provided contacting the anti-static layer may have the improved coating reliability.

Although the embodiments of the invention have been described, it is understood that the invention should not be limited to these embodiments but various changes and modifications can be made by one ordinary skilled in the art within the spirit and scope of the invention as hereinafter claimed. Hence, the real protective scope of the invention shall be determined by the technical scope of the accompanying claims.

What is claimed is:

1. An electronic device comprising: a display panel;
a protection film which faces the display panel, the protection film comprising:
a first anti-static layer which defines a first surface of the protection film which is closest to the display panel;
a second anti-static layer which faces the first anti-static layer and defines a second surface of the protection film which is opposed to the first surface;
a polyimide film between the first anti-static layer and the second anti-static layer;
the first surface of the protection film which is defined by the first anti-static layer having a surface resistance and a polar surface energy of about 12 millinewtons per meter or more and about 22 millinewtons per meter or less; and
the polyimide film having a surface resistance and a surface energy of about 39 millinewtons per meter or more; and
an adhesive layer which forms an interface with the first surface of the protection film and attaches the protection film to the display panel, the adhesive layer having a top surface which forms an interface with the display panel and has a surface resistance,
wherein
the surface resistance of the polyimide film is greater than the surface resistance of the first surface of the protection film, and
the surface resistance of the top surface of the adhesive layer is greater than the surface resistance of the first surface of the protection film and lower than the surface resistance of the polyimide film.

2. The electronic device of claim 1, wherein the polyimide film comprises biphenyl-tetracarboxylic acid dianhydride and a filler.

3. The electronic device of claim 2, wherein the filler has a size of about 0.5 micrometer or more and about 2 micrometer or less.

4. The electronic device of claim 1, wherein each of the first anti-static layer and the second anti-static layer comprises a binder including urethane.

5. The electronic device of claim 4, wherein each of the first anti-static layer and the second anti-static layer comprises isocyanate.

6. The electronic device of claim 1, wherein the surface resistance of the first surface of the protection film with which the adhesive layer forms the interface is about $10^6$ Ohms per square or less.

7. The electronic device of claim 1, wherein the surface resistance of the top surface of the adhesive layer is about $10^9$ Ohms per square or more and about $10^{11}$ Ohms per square or less.

8. The electronic device of claim 1, wherein the adhesive layer which attaches the protection film to the display panel has a thickness of about 10 micrometers or more and about 25 micrometers or less.

9. The electronic device of claim 1, wherein the polyimide film has a yield point at a strain of about 1.5% or more.

10. The electronic device of claim 1, wherein the polyimide film has a haze of about 5% or less.

11. An electronic device comprising:
a display panel;
a protection film which faces the display panel; and
an adhesive layer which attaches the display panel to the protection film and comprises a top surface which forms an interface with the display panel and has a surface resistance,
wherein the protection film comprises:
a first anti-static layer which is directly attached to the adhesive layer, defines a first surface of the protection film, the first anti-static layer comprising:
a first binder including a first anti-static material;
a first surface of the first anti-static layer which is closest to the display panel, directly attached to the adhesive layer and has a surface resistance, and
the first surface of the first anti-static layer which is directly attached to the adhesive layer having a polar surface energy of about 12 millinewtons per meter or more and about 22 millinewtons per meter or less;
a base film facing the adhesive layer with the first anti-static layer therebetween and having a surface resistance;
the base film having a surface energy of about 39 millinewtons per meter or more,
wherein
the surface resistance of the base film is greater than the surface resistance of the first surface of the first anti-static layer, and
the surface resistance of the top surface of the adhesive layer is greater than the surface resistance of the first surface of the first anti-static layer and lower than the surface resistance of the base film.

12. The electronic device of claim 11, wherein the base film comprises a filler having a size of about 0.5 micrometer or more and about 2 micrometers or less.

13. The electronic device of claim 11, wherein the protection film further comprises a second anti-static layer which faces the first anti-static layer with the base film therebetween and comprises a second binder including urethane and a second anti-static material.

14. The electronic device of claim 11, wherein
wherein the base film comprises biphenyl-tetracarboxylic acid dianhydride, and
wherein the first binder further comprises urethane.

15. The electronic device of claim 11, wherein
the first anti-static layer comprises a first surface which is closest to the display panel and directly attached to the adhesive layer, and
the surface resistance of the first surface of the first anti-static layer directly attached to the adhesive layer is about $10^6$ Ohms per square or less.

16. The electronic device of claim 11, wherein the surface resistance of top surface of the adhesive layer is about $10^9$ Ohms per square or more and about $10^{11}$ Ohms per square or less.

17. The electronic device of claim 11, wherein the adhesive layer which attaches the display panel to the protection film has a thickness of about 10 micrometers or more and about 25 micrometers or less.

18. The electronic device of claim 11, wherein the first anti-static layer which is directly attached to the adhesive layer further comprises isocyanate.

* * * * *